(12) United States Patent
Winarski

(10) Patent No.: US 9,328,018 B2
(45) Date of Patent: May 3, 2016

(54) GRAPHENE COATED OPTIC FIBERS

(71) Applicant: Tyson York Winarski, Mountain View, CA (US)

(72) Inventor: Tyson York Winarski, Mountain View, CA (US)

(*) Notice: Subject to any disclaimer, the term of this patent is extended or adjusted under 35 U.S.C. 154(b) by 21 days.

(21) Appl. No.: 14/673,872

(22) Filed: Mar. 31, 2015

(65) Prior Publication Data

US 2015/0205040 A1    Jul. 23, 2015

Related U.S. Application Data

(63) Continuation-in-part of application No. 14/070,574, filed on Nov. 3, 2013.

(51) Int. Cl.
| | | |
|---|---|---|
| *G02B 6/02* | (2006.01) | |
| *C03C 25/10* | (2006.01) | |
| *G02B 6/25* | (2006.01) | |
| *G02B 6/38* | (2006.01) | |
| *G02B 6/10* | (2006.01) | |

(52) U.S. Cl.
CPC ........ *C03C 25/1075* (2013.01); *G02B 6/02395* (2013.01); *G02B 6/25* (2013.01); *G02B 6/102* (2013.01); *G02B 6/3849* (2013.01)

(58) Field of Classification Search
CPC .............................. G02B 6/0229; H01S 3/067
See application file for complete search history.

(56) References Cited

U.S. PATENT DOCUMENTS 6,585,432 B1 * 7/2003 Palese .................... H04B 10/11
                                                        398/128

2011/0158268 A1* 6/2011 Song ..................... H01S 3/1118
                                                         372/18
2011/0222562 A1* 9/2011 Jiang ....................... H01S 3/067
                                                         372/6
2011/0285999 A1* 11/2011 Kim ..................... G01N 21/552
                                                         356/445

OTHER PUBLICATIONS

Ariel Ismach, Clara Druzgalski, Samuel Penwell, Adam Schwartzberg, Maxwell Zheng, Ali Javey, Jeffrey Bokor, and Yuegang Zhang, Direct Chemical Vapor Deposition of Graphene on Dielectric Surfaces, Nano Lett. 2010, 10, 1542-1548, American Chemical Society, Apr. 2, 2010.
Rui Wang, Yufeng Hao, Ziqian Wang, Hao Gong, and John T. L. Thong in Large-Diameter Graphene Nanotubes Synthesized Using Ni Nanowire Templates, Nano Lett. 2010, 10, 4844-4850, American Chemical Society, Oct. 28, 2010.
Jan Wasylak, Maria Lacka, Jan Kucharski. Glass of high refractive index for optics and optical fiber. Opt. Eng. 36(6) 1648-1651 (Jun. 1997) Society of Photo-Optical Instrumentation Engineers.
Jie Sun, Niclas Lindvall, Matthew T. Cole, Teng Wang, Tim J. Booth, Peter Bøggild, Kenneth B. K. Teo, Johan Liu, and August Yurgens. Controllable chemical vapor deposition of large area uniform nanocrystalline graphene directly on silicon dioxide. Journal of Applied Physics 111, 044103 (2012).

(Continued)

*Primary Examiner* — Michelle R Connelly
*Assistant Examiner* — Hoang Tran
(74) *Attorney, Agent, or Firm* — The Winarski Firm, PLLC

(57) ABSTRACT

A graphene coated optic fiber is disclosed. An optic fiber core is encapsulated within a graphene capsule. An optic fiber having cladding layer encapsulated within a graphene capsule is also disclosed. The graphene capsule may comprise a single layer of graphene, bi-layer of graphene, or multiple layers of graphene. An optical circuit is disclosed that transmits ultraviolet light across an optic fiber encapsulated with graphene.

19 Claims, 13 Drawing Sheets

(56) References Cited

OTHER PUBLICATIONS

Zhancheng Li, Ping Wu, Chenxi Wang, Xiaodong Fan, Wenhua Zhang, Xiaofang Zhai, Changgan Zeng, Zhenyu Li, Jinlong Yang, and Jianguo Hou. Low-Temperature Growth of Graphene by Chemical Vapor Deposition Using Solid and Liquid Carbon Sources. ACSNANO vol. 5, No. 4, 3385-3390, 2011.

Takatoshi Yamada, Masatou Ishihara, and Masataka Hasegawa. Low Temperature Graphene Synthesis from Poly (methyl methacrylate) Using Microwave Plasma Treatment. Applied Physics Express 6 (2013) 115102-1.

Alex Gray, Mehdi Balooch, Stephane Allegret, Stefan De Gendt, and Wei-E Wang. Optical detection and characterization of graphene by broadband spectrophotometry. Journal of Applied Physics 104, 053109 (2008).

* cited by examiner

GRAPHENE COATED OPTIC FIBERS

This application claims the benefit of U.S. patent application Ser. No. 14/070,574 filed on Nov. 3, 2013, which is also hereby incorporated by reference.

BACKGROUND

Fiber optic cables are favored for modern data communication. Fiber optic cable offers large bandwidth for high-speed data transmission. Signals can be sent farther than across copper cables without the need to "refresh" or strengthen the signal. Fiber optic cables offer superior resistance to electromagnetic noise, such as from adjoining cables. In addition, fiber optic cables require far less maintenance than metal cables, thereby making fiber optic cables more cost effective.

Optical fiber is made of a core that is surrounded by a cladding layer. The core is the physical medium that transports optical data signals from an attached light source to a receiving device. The core is a single continuous strand of glass or plastic that is measured (in microns) by the size of its outer diameter. The larger the core, the more light the cable can carry. All fiber optic cable is sized according to its core diameter. The three diameters of the most commonly available multimode cores are 50-micron, 62.5-micron, and 100-micron, although single-mode cores may be as small as 8-10 microns in diameter. The cladding is a thin layer that surrounds these micrometer sized fiber cores. It is the core-cladding boundary that contains the light waves within the core by causing the high-angle reflection as measured relative to a line perpendicular to this boundary, such as a core-diametral line, enabling data to travel throughout the length of the fiber segment. Typically, the core and cladding are made of high-purity silica glass. The light signals remain within the optical fiber core due to total or near-total internal reflection within the core, which is caused by the difference in the refractive index between the cladding and the core.

The cladding is typically coated with a layer of acrylate polymer or polymide, thereby forming an insulating jacket. This insulating jacket protects the optic fiber from damage. This coating also reinforces the optic fiber core, absorbs mechanical shocks, and provides extra protection against excessive cable bends. These insulating jacket coatings are measured in microns and typically range from 250 microns to 900 microns.

Strengthening fibers are then commonly wrapped around the insulating jacket. These fibers help protect the core from crushing forces and excessive tension during installation. The strengthening fibers can be made of KEVLAR™ for example. An outer cable jacket is then provided as the outer layer of the cable. The outer cable jacket surrounds the strengthening fibers, the insulating jacket, the cladding and the optic fiber core. Typically, the outer cable jacket is colored orange, black, or yellow.

It is highly desirable to develop advanced optic fibers that can transmit data at higher rates, thereby increasing data bandwidth.

SUMMARY

A graphene coated optic-fiber is disclosed that includes an optic fiber core. The optic-fiber also includes a graphene capsule that encapsulates the optic fiber core. The graphene capsule forms a cladding layer. The graphene capsule may be formed of a monolayer of graphene, a bi-layer graphene, or multilayer graphene. The graphene capsule may be deposited onto the optic fiber core through a Chemical Vapor Deposition (CVD) process. The graphene capsule is formed of a graphene cylinder with two circular graphene end surfaces. The graphene cylinder is formed through a CVD process. The two circular graphene end surfaces are adhered to end surfaces of the optic fiber core. Carbon-carbon bonds may be formed between the two circular graphene end surfaces and the graphene cylinder via exposure to a carbon atmosphere. The optic fiber core may be made of silica, a halide-chalcogenide glass, PbO glass, or Lanthanum dense flint glass.

A graphene coated optic-fiber is disclosed that includes an optic fiber core and a cladding layer surrounding the optic fiber core. A graphene capsule encapsulates the cladding layer, thereby also encapsulating the optic fiber core. The graphene capsule forms an optic-waveguide. The graphene capsule is formed of a monolayer of graphene, a bi-layer graphene, or multilayer graphene. The optic fiber core and cladding layer may be formed of silica. The graphene capsule can be deposited on the silica cladding through a CVD process.

An optical circuit is disclosed that includes an ultraviolet light source and an ultraviolet receiver circuit. An optic fiber optically connects the ultraviolet light source to the ultraviolet receiver circuit. The optic fiber includes an optic fiber core encapsulated with graphene. The optic fiber may further include a cladding layer between the optic fiber core and the graphene.

Further aspects of the invention will become apparent as the following description proceeds and the features of novelty which characterize this invention are pointed out with particularity in the claims annexed to and forming a part of this specification.

BRIEF DESCRIPTION OF THE DRAWINGS

The novel features that are considered characteristic of the invention are set forth with particularity in the appended claims. The invention itself, however, both as to its structure and operation together with the additional objects and advantages thereof are best understood through the following description of the preferred embodiment of the present invention when read in conjunction with the accompanying drawings, wherein:

DETAILED DESCRIPTION

While the invention has been shown and described with reference to a particular embodiment thereof, it will be understood to those skilled in the art, that various changes in form and details may be made therein without departing from the spirit and scope of the invention.

Figure 1:
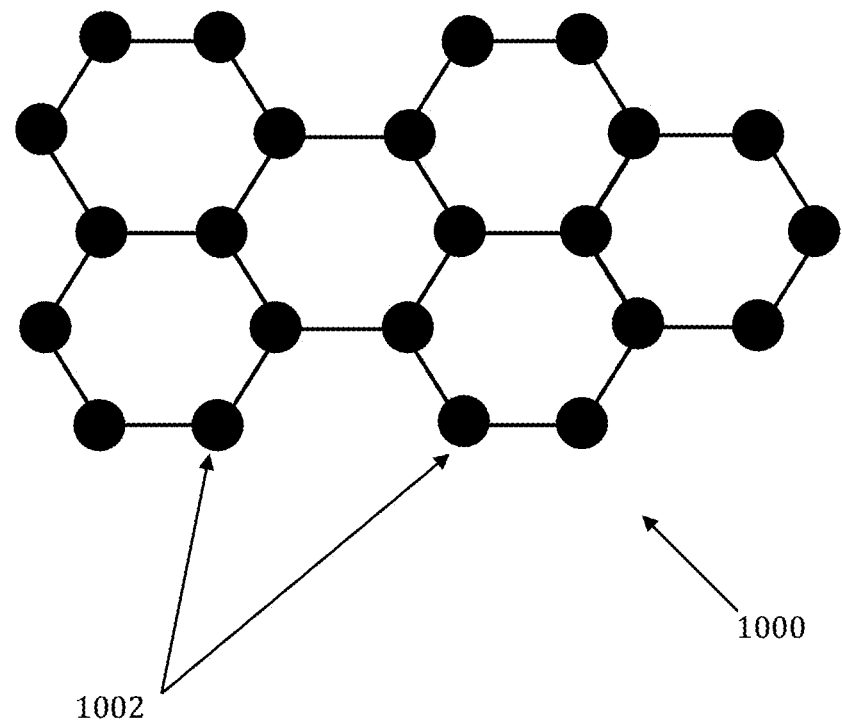
FIG. 1 illustrates a diagram of carbon atoms in a diamond lattice forming an atomically contiguous sheet of graphene.

FIG. 1 illustrates a diagram of carbon atoms 1002 in a diamond lattice forming an atomically contiguous sheet of graphene 1000. Graphene sheet 1000, also referred to as a graphene lattice 1000, is a flat monolayer of carbon atoms 1002 that are tightly packed into a two-dimensional lattice, thereby forming a sheet of graphene. Graphene lattice 1000 is 97.7% optically transparent. Thus, light used in combination with fiber optic cables can pass through a graphene layer for purposes of data transmission within a fiber optic communications network. Graphene lattice 1000 is an extremely strong material due to the covalent carbon-carbon bonds. It is desirable to utilize graphene lattices 1000 that are defect free as the presence of defects reduces the strength of graphene lattice 1000. The intrinsic strength of a defect free sheet of graphene 100 is 42 $Nm^{-1}$, making it one of the strongest materials known. The strength of graphene is comparable to the hardness of diamonds. Graphene is also a highly flexible material. Multiple monolayers of graphene sheet 1000 can be grown on top of each other to create a multi-layer graphene sheet. As discussed in FIG. 11, graphene exhibits a wavelength dependent index of refraction. It is therefore possible for graphene to function as a cladding layer in optic fiber applications when paired with an appropriate fiber optic core that has an index of refraction higher than that of graphene.

Figure 2:
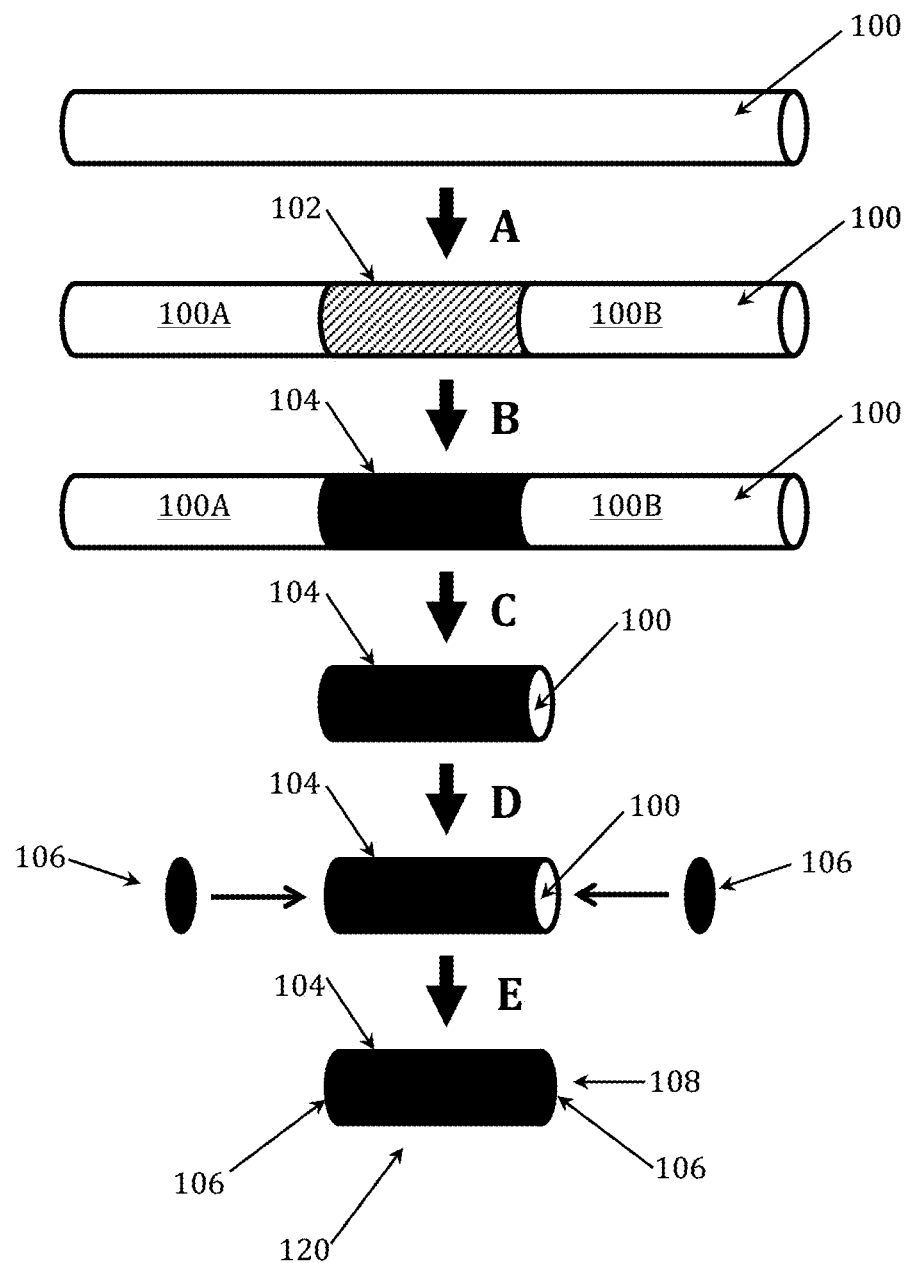
FIG. 2 illustrates a process schematic of fabricating an optic fiber having a core encapsulated by a graphene layer that forms cladding around the optic fiber core.

FIG. 2 illustrates a process schematic of fabricating an optic fiber 108 having a core 100 encapsulated by a graphene layer 120 that forms cladding around the optic fiber core 100. Initially, an optic fiber core 100 was prepared and cleaned with alcohol and acetone. Preferably, optic fiber core 100 is made of silica. However, other materials for optic fiber core 100 may be used. The use of silica is exemplary. In process step A, a copper layer 102 is deposited around the middle of optic fiber core 100. Copper layer 102 may be deposited via a sputtering method. One exemplary thickness for copper layer 102 is 1.3 µm. An exemplary length for copper layer 102 is 0.5 cm to 2 cm. However, any length of copper layer 102 may be created. Copper layer 102 is a sacrificial layer deposited to support the deposition of graphene layer 104 on optic fiber core 100. Alternatively, sacrificial copper film 102 may be evaporated onto optic fiber core 100 through use of an electron-beam evaporation process. Note that optic fiber core regions 100A and 100B are not covered by copper film 102. Next in step B, optic fiber core 100 with copper layer 102 is placed within a Chemical Vapor Deposition (CVD) chamber. In one exemplary process, under a controlled temperature and pressure of 900° C. and 1 MPa and catalyzed by copper layer 102, a monolayer of graphene 104 was grown on copper layer 102 in 2 hours using $H_2$ and $CH_4$ at 50 sccm. Multilayer graphene can be grown on optic fiber core 100 through longer growth times. Subsequently, the temperature within the CVD chamber was increased to 1100° C. and the pressure was decreased to 100 kPa and held constant for a period of 10 hours during which the copper atoms evaporated off, thereby leaving a graphene cylinder 104 surrounding optic fiber core 100 without any intervening copper layer 102. Silica optic fiber core 100 is resilient to morphological changes at 900-1100° C. required for the CVD growth of high-quality graphene due to the high melting point of silica of 1600° C.

Next, in step C, bare optic fiber core ends 100A and 100B are cut off and removed from the portion of optic fiber core 100 covered with graphene cylinder 104. In step C, graphene cylinder 104 covers the length of the remaining portion of optic fiber core 100. However, the ends of optic fiber core 100 remain uncovered with graphene. In this step, optic fiber core 100 and graphene cylinder 104 are cleaned with acetone, alcohol and deionized water. In step D, premade circular graphene films 106 are applied to the ends of optic fiber 100, thereby encapsulating optic fiber 100 within a graphene capsule 120 formed of graphene cylinder 104 and graphene ends 106. Subsequently in step E, optic fiber core may optionally be exposed to a carbon atmosphere to create carbon-carbon bonds between graphene ends 106 and graphene cylinder 104. Graphene cylinder 104 functions as a cladding layer around optic fiber 100. Cladding 104 is one or more layers of materials of lower refractive index, in intimate contact with a core material 100 of higher refractive index. The cladding 104 causes light to be confined to the core of the fiber 100 by total internal reflection at the boundary between the two layers. Light propagation in the cladding 104 is suppressed in typical fiber. Some fibers can support cladding modes in which light propagates in the cladding 104 as well as the core 100. Further, due to its strength and flexibility, graphene cylinder 104 functions to provide mechanical support to optic fiber core 100. Circular graphene sheets 106 protect the ends of optic fiber core 100 from mechanical damage.

The above process for forming a graphene capsule 120 around optic fiber core 100 is exemplary. Other processes may be used to form an optic fiber formed of a silica optic fiber core 100 surrounded by a graphene capsule 120 functioning as a cladding layer. For example, CVD may be used to entirely grow a graphene capsule around silica optic fiber 100. CVD of graphene onto a solid circular rod such as a nanowire or a silica optic fiber core 100 produces a graphene capsule that completely encapsulates silica optic fiber 100. This graphene capsule is formed of a cylinder of graphene surrounding optic fiber core 100 along its length with graphene surfaces covering the two ends of the graphene cylinder. The process begins with evaporating a sacrifical copper film 102 onto the silica optic fiber core 100 as shown in FIG. 2. An electron-beam evaporation process is used to deposit the copper film onto the silica optic fiber. Next, silica optic fiber core 100 having sacrificial copper layer 102 is inserted into a CVD chamber. Silica optic fiber core 100 is heated to 1000° C. CVD of graphene is the performed on optic fibers core 100 with durations varying from 15 min up to 7 h at 1000° C. Given the fact that that the melting temperature of the copper is ~1084° C., along with the high temperature during the growth of ~1000° C., and the low pressure in the chamber, 100-500 mTorr, copper film 102 de-wets and evaporates during the CVD process. Ethylene ($C_2H_4$) or $CH_4$ is introduced into the CVD chamber as the carbon-containing precursor, in addition to the $H_2$/Ar flow. The precursor feeding time, typically in the order of a few to tens of seconds, determines the number of layers of graphene grown. The sample may then be cooled to room temperature within 5 min in a flow of 133 sccm Ar at 20 Torr chamber pressure. Silica optic fiber core 100 is resilient to morphological changes at ~1000° C. required for the CVD growth of high-quality graphene due to the high melting point of silica of 1600° C. During this CVD process, sacrificial copper layer 102 de-wets and evaporates exposing silica optic fiber core 100 directly to graphene layer 104 and 106. In this process, graphene ends 106 are formed on optic fiber core through CVD deposition.

A monolayer of graphene 120 may be formed on optic fiber core 100. Alternatively, multilayer graphene 120 may be formed on optic fiber core 100. The number of graphene sheets is determined by the growth time and is independent of tube diameter and tube length. As a consequence of this process, a silica optic fiber core 100 is encapsulated within a graphene capsule 120. Graphene capsule 120 provides mechanical strength to optic fiber core 100.

Processes for creating tubular graphene structures, also known as carbon nanotubes, have been demonstrated on 70 nm Nickel (Ni) nanowires as described in the following publication, hereby incorporated by reference: Rui Wang, Yufeng Hao, Ziqian Wang, Hao Gong, and John T. L. Thong in *Large-Diameter Graphene Nanotubes Synthesized Using Ni Nanowire Templates*, Nano Lett. 2010, 10, 4844-4850, American Chemical Society, Oct. 28, 2010. However, unlike the process disclosed by Wang utilizing a sacrificial Ni nanowire template, the present invention utilizes a silica optic fiber core 100 that is retained as an essential component of the optic fiber contained within a cylindrical graphene sheet, i.e. a carbon nanotube, capped at both ends to encapsulate optic fiber core 100. Processes for direct chemical vapor deposition of graphene on dielectric surfaces such as silica are described in the following publication, hereby incorporated by reference: Ariel Ismach, Clara Druzgalski, Samuel Penwell, Adam Schwartzberg, Maxwell Zheng, Ali Javey, Jeffrey Bokor, and Yuegang Zhang, *Direct Chemical Vapor Deposition of Graphene on Dielectric Surfaces*, Nano Lett. 2010, 10, 1542-1548, American Chemical Society, Apr. 2, 2010.

In another exemplary process, graphene capsule 120 may be deposited directly on to optic fiber core 100 without the use of a metal catalyst, such as sacrificial copper layer 102. The CVD is performed in an atmospheric pressure hot-wall quartz tube furnace. $CH_4$ is used as a carbon precursor gas, mixed with auxiliary reduction ($H_2$) and carrier (Ar) gases. The optic fiber core 100 is heated to 1000° C. (at a rate of 30° C./min) under $H_2$ (50 sccm) and Ar (1000 sccm) atmosphere and kept at 1000° C. for 3 min. Then, 300 sccm $CH_4$ is introduced to initiate the formation of graphene. The typical growth time is 30-60 min. After the deposition, the $CH_4$ flow is stopped, leaving other gases to flow for further 3 min to remove residual reaction gases before allowing the chamber to naturally cool to room temperature (20° C./min) in the same $H_2$—Ar atmosphere. The graphene layer 104 can also be deposited directly on $SiO_2$ by using other hydrocarbon precursors, such as $C_2H_2$, showing the generality of the process. The growth of graphene directly on a silica substrate is reported in the following publication, hereby incorporated by reference: Jie Sun, Niclas Lindvall, Matthew T. Cole, Teng Wang, Tim J. Booth, Peter Bøggild, Kenneth B. K. Teo, Johan Liu, and August Yurgens. *Controllable chemical vapor deposition of large area uniform nanocrystalline graphene directly on silicon dioxide*. Journal of Applied Physics 111, 044103 (2012).

While optic fiber core 100 may be formed of silica, other glasses with higher indicies of refraction may be used for optic fiber core 100. For example, it may be desirable to make optic fiber core from halide-chalcogenide glasses. The processes discussed above are not compatible with halide-chalcogenide glasses due to the high temperatures of the CVD process. Halide-chalcogenide glasses have a melting temperature of 378° C. and would not survive a CVD process at 900-1100° C. However, a variety of low-temperature graphene synthesis techniques are known with very low thermal budgets. With these techniques, the halide-chalcogenide glasses are heated to temperatures around 300° C. for graphene growth. For example, a halide-chalcogenide optic fiber core 100 may be heated in a CVD chamber to 300° C. and exposed to a benzene precursor as the carbon source to create a monolayer of graphene. This process is reported in the following publication, hereby incorporated by reference: Zhancheng Li, Ping Wu, Chenxi Wang, Xiaodong Fan, Wenhua Zhang, Xiaofang Zhai, Changgan Zeng, Zhenyu Li, Jinlong Yang, and Jianguo Hou. *Low-Temperature Growth of Graphene by Chemical Vapor Deposition Using Solid and Liquid Carbon Sources*. ACSNANO VOL. 5, NO. 4, 3385-3390, 2011. In an alternative low temperature process, graphene film may be synthesized on a halide-chalcogenide optic fiber 100 at 280° C. utilizing a microwave plasma treatment in combination with PolyMethylMethacrylate (PMMA). With this process, a layer of PMMA is spin-coated onto a halide-chalcogenide optic fiber core 100 at room temperature. The PMMA coated halide-chalcogenide optic fiber core 100 is then inserted into a slot antenna-type microwave plasma CVD system for microwave plasma treatment at 280° C. The plasma treatment time is 30 seconds. This plasma treatment process is disclosed in the following publication, hereby incorporated by reference: Takatoshi Yamada, Masatou Ishihara, and Masataka Hasegawa. *Low Temperature Graphene Synthesis from Poly(methyl methacrylate) Using Microwave Plasma Treatment*. Applied Physics Express 6 (2013) 115102-1.

Silica optic fiber core 100 may have a various diameters depending upon the wavelength of light it is configured to support. For example, for transmitting UV light with a wavelength of 200-400 nm, silica optic fiber may have a diameter larger than the 200-400 nm wavelength range of the light. For transmitting light having a wavelength in the range of 400-600 nm in the violet-yellow spectrum, silica optic fiber may have a diameter larger than 400-600 nm. For transmitting light having a wavelength in the range of 600-800 nm in the orange to red spectrum, silica optic fiber may have a diameter larger than 600-800 nm. For light having a wavelength in the range of 800-1000 nm in the infrared spectrum, silica optic fiber may have a diameter larger than 800-1000 nm. These diameter ranges are merely exemplary and are non-limiting.

Figure 3:
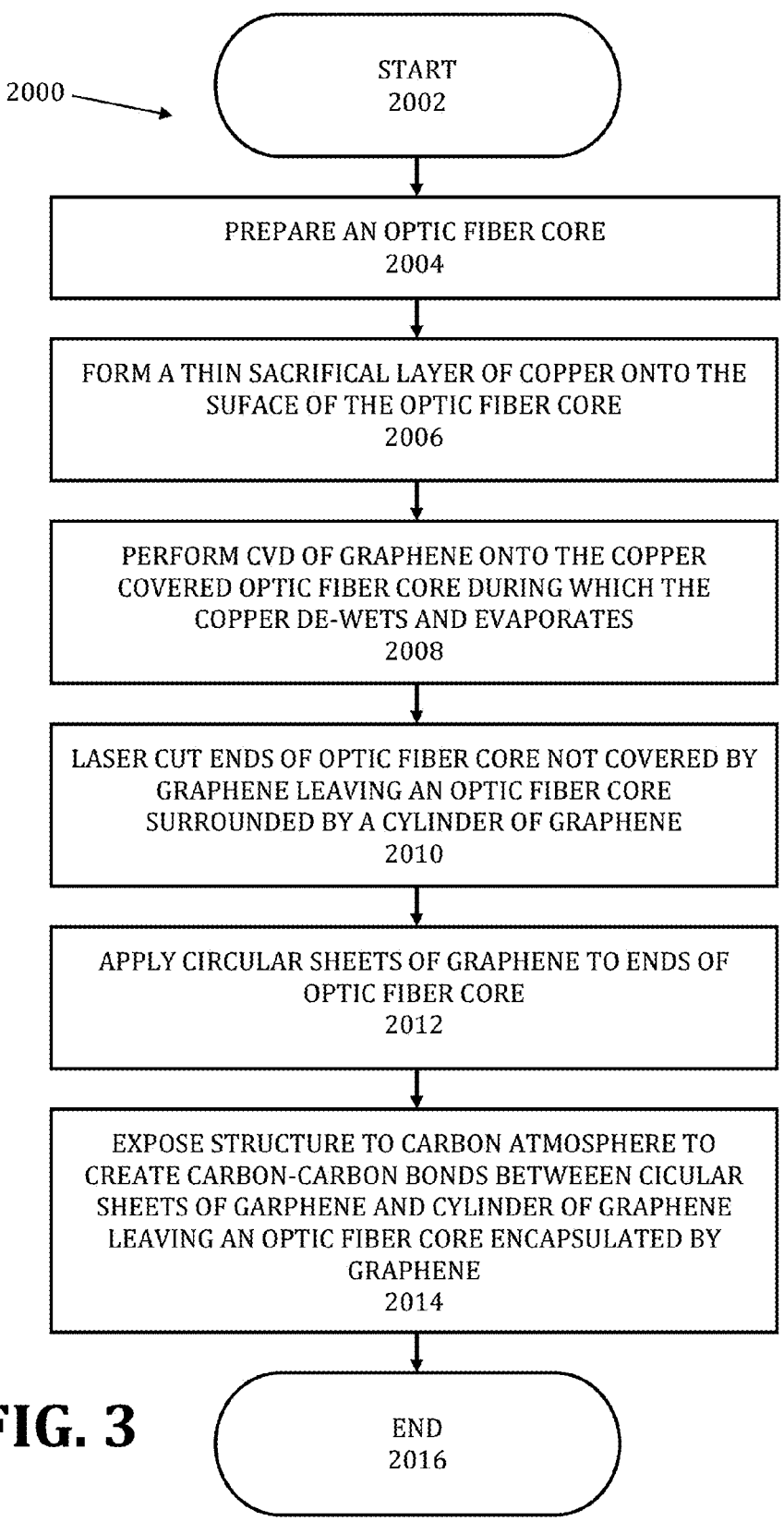
FIG. 3 illustrates a flow chart depicting a process of fabricating an optic fiber having a core encapsulated by a graphene layer that forms cladding around the optic fiber core.

FIG. 3 illustrates a flow chart 2000 depicting an exemplary process of fabricating an optic fiber 108 having a core 100 encapsulated by a graphene layer 120 that forms cladding around the optic fiber core 100. The process begins with START 2002. An optic fiber core made of silica is prepared and cleaned with acetone and alcohol in step 2004. In step 2006, a thin sacrificial layer of copper is formed onto the surface of optic fiber core 100. Next in step 2008, a CVD process is performed depositing graphene layer 104 onto optic fiber core 100 during which the sacrificial copper layer 102 evaporates. Then in step 2010, the ends of optic fiber core 100 not covered by graphene cylinder 104 are cut for example, by a laser. In this step, optic fiber core 100 and graphene cylinder 104 are cleaned. In step 2012, circular sheets of graphene 106 are applied to the ends of optic fiber core 100, thereby forming a graphene capsule encapsulating optic fiber core 100. In step 2014, exposing graphene sheets 106 and graphene cylinder 104 to a carbon atmosphere creates carbon-carbon bonds between graphene cylinder and graphene sheets 106, thereby further creating a graphene capsule encapsulating optic fiber core 100. The process ENDS with step 2016.

Figure 4:
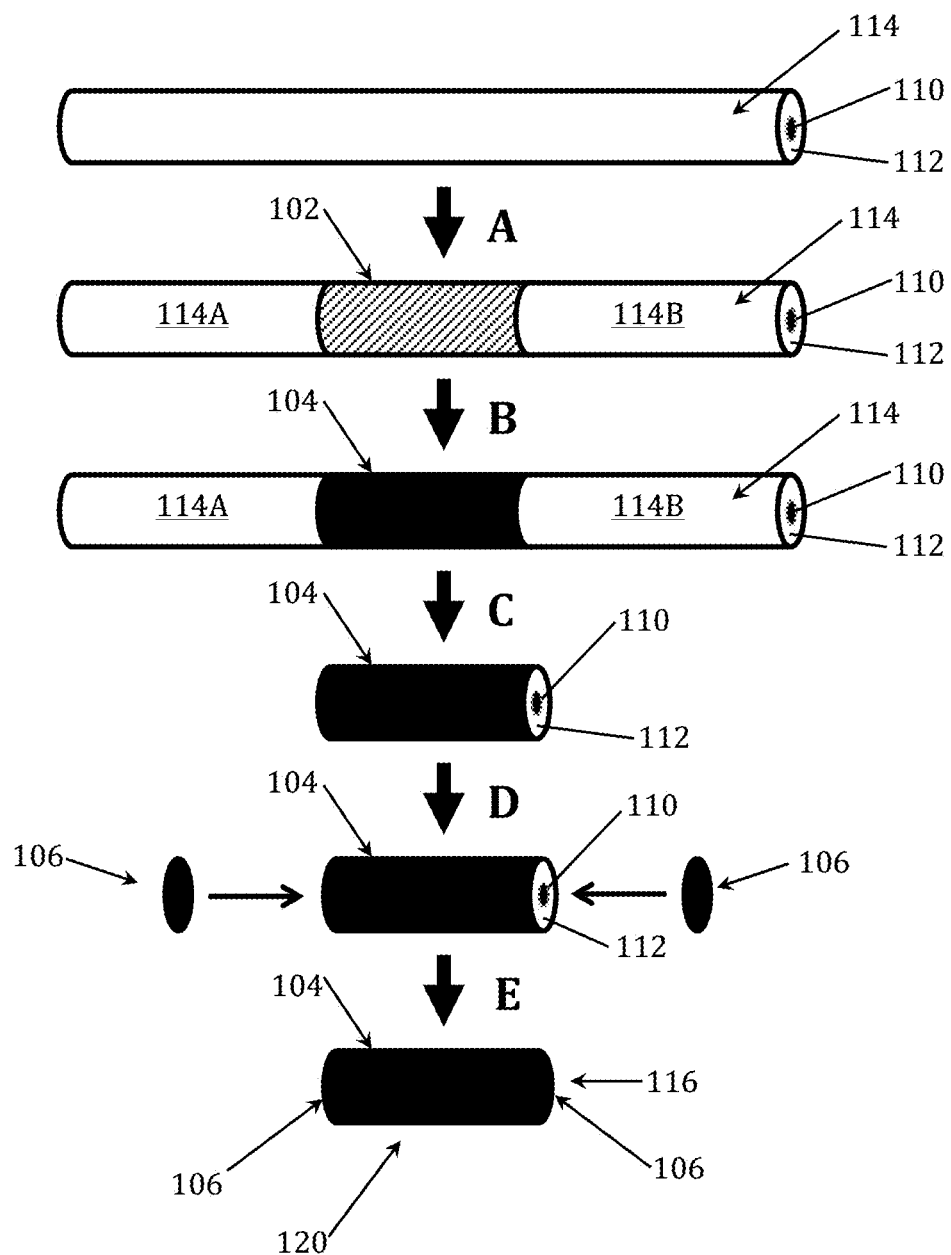
FIG. 4 illustrates a process schematic of fabricating an optic fiber having a core and cladding encapsulated by a graphene layer.

FIG. 4 illustrates a process schematic of fabricating an optic fiber 114 having a core 110 and cladding 112 encapsulated by a graphene layer 120. Initially, an optic fiber 114 was prepared and cleaned with alcohol and acetone. Optic fiber core 110 may be formed of silica. Optic fiber cladding 112 may also be formed of silica. In this example, as both core 110 and cladding 112 are formed of silica, CVD processes may be used to deposit graphene on fiber 114. The use of silica for core 110 and cladding 112 is exemplary. Other materials for optic fiber core 110 and cladding 112 may be used.

In process step A, a copper layer 102 is deposited around the middle of optic fiber 114. Copper layer 102 may be deposited via a sputtering method. One exemplary thickness for copper layer 102 is 1.3 µm. An exemplary length for copper layer 102 is 0.5 cm to 2 cm. However, any length of copper layer 102 may be created. Copper layer 102 is a sacrificial layer deposited to support the deposition of graphene layer 104 on optic fiber 114. Alternatively, sacrificial copper film 102 may be evaporated onto optic fiber core 100 through use of an electron-beam evaporation process. Note that optic fiber core regions 114A and 114B are not covered by copper film 102. Next in step B, optic fiber 114 with copper layer 102 is placed within a Chemical Vapor Deposition (CVD) chamber. In one exemplary process, under a controlled temperature and pressure of 900° C. and 1 MPa and catalyzed by copper layer 102, a monolayer of graphene 104 was grown on copper layer 102 in 2 hours using $H_2$ and $CH_4$ at 50 sccm. Multilayer graphene can be grown on optic fiber core 100 through longer growth times. Subsequently, the temperature within the CVD chamber was increased to 1100° C. and the pressure was decreased to 100 kPa and held constant for a period of 10 hours during which the copper atoms evaporated off, thereby leaving a graphene cylinder 104 surrounding optic fiber 114 without any intervening copper layer 102. Silica optic fiber 114 is resilient to morphological changes at 900-1100° C. required for the CVD growth of high-quality graphene due to the high melting point of silica of 1600° C.

Next, in step C, bare optic fiber ends 114A and 114B are cut off and removed from the portion of optic fiber 114 covered with graphene cylinder 104. In step C, graphene cylinder 104 covers the length of optic fiber 114. However, the ends of optic fiber 114 remain uncovered with graphene. In this step, optic fiber 114 and graphene cylinder 104 are cleaned with acetone, alcohol and deionized water. In step D, premade circular graphene films 106 are applied to the ends of optic fiber 114, thereby encapsulating optic fiber 114 within a graphene capsule formed of graphene cylinder 104 and graphene ends 106. Subsequently in step E, optic fiber may optionally be exposed to a carbon atmosphere to create carbon-carbon bonds between graphene ends 106 and graphene cylinder 104. Cladding 112 is one or more layers of materials of lower refractive index, in intimate contact with a core material 110 of higher refractive index. The cladding 112 causes light to be confined to the core of the fiber 110 by total internal reflection at the boundary between the two layers. Light propagation in the cladding 112 is suppressed in typical fiber. Some fibers can support cladding modes in which light propagates in the cladding 112 as well as the core 110. Due to its strength and flexibility, graphene cylinder 104 functions to provide mechanical support to optic fiber 114. Circular graphene sheets 106 protect the ends of optic fiber 114 from mechanical damage. Graphene cylinder, due to its optic properties, may function as an optic waveguide in combination with cladding 112.

The above process for forming a graphene capsule around optic fiber 114 is exemplary. Other processes may be used to form an optic fiber formed of a silica optic fiber core 110 and cladding 112 surrounded by a graphene capsule. For example, CVD may be used to entirely grow a graphene capsule around silica optic fiber 114. CVD of graphene onto a solid circular rod such as a nanowire or a silica optic fiber 114 produces a graphene capsule that completely encapsulates silica optic fiber 114. This graphene capsule is formed of a cylinder of graphene surrounding optic fiber 114 along its lengths with graphene surfaces covering the two ends of the graphene cylinder. The process begins with evaporating a sacrificial copper film 102 onto the silica optic fiber 114 as shown in FIG. 4. An electron-beam evaporation process is used to deposit the copper film 102 onto the silica optic fiber 114. Next, silica optic fiber 114 having sacrificial copper layer 102 is inserted into a CVD chamber. Silica optic fiber 114 is heated to 1000° C. CVD of graphene is the performed on optic fibers 114 with durations varying from 15 min up to 7 h at 1000° C. Given the fact that that the melting temperature of the copper is ~1084° C., along with the high temperature during the growth of ~1000° C., and the low pressure in the chamber, 100-500 mTorr, copper film 102 de-wets and evaporates during the CVD process. Ethylene ($C_2H_4$) or $CH_4$ is introduced into the CVD chamber as the carbon containing precursor, in addition to the $H_2$/Ar flow. The precursor feeding time, typically in the order of a few to tens of seconds, determines the number of layers of graphene grown. The sample may then be cooled to room temperature within 5 min in a flow of 133 sccm Ar at 20 Torr chamber pressure. Silica optic fiber 114 is resilient to morphological changes at ~1000° C. required for the CVD growth of high-quality graphene due to the high melting point of silica of 1600° C. During this CVD process, sacrificial copper layer 102 de-wets and evaporates exposing silica optic fiber 114 directly to graphene layer 104 and 106. In this process, graphene ends 106 are formed on optic fiber 114 through CVD deposition.

A monolayer of graphene 120 may be formed on optic fiber 114. Alternatively, multilayer graphene 120 may be formed on optic fiber 114. The number of graphene sheets is determined by the growth time and is independent of tube diameter and tube length. As a consequence of this process, a silica optic fiber 114 is encapsulated within a graphene capsule 120. Graphene capsule 120 provides mechanical strength to optic fiber 114. It is contemplated that the above discussed CVD process of graphene deposition may occur on conventional silica optic fibers having dimensions of 8-10-microns, 50-microns, 62.5-microns, and 100-microns. These diameter ranges are merely exemplary and are non-limiting. Another process of forming a graphene capsule 120 can be performed through wrapping optic fiber core 100 with a prefabricated sheet of graphene, thereby forming a graphene cylinder 104 around optic fiber core 100. Circular graphene ends 106 can then be adhered to the ends of optic fiber core, thereby encapsulating optic fiber core. Carbon-carbon bonds can be formed between graphene cylinder 104 and circular graphene ends 106 by exposure to a carbon atmosphere.

Processes for creating tubular graphene structures, also known as carbon nanotubes, have been demonstrated on 70 nm Nickel (Ni) nanowires as described in the following publication, hereby incorporated by reference: Rui Wang, Yufeng Hao, Ziqian Wang, Hao Gong, and John T. L. Thong in *Large-Diameter Graphene Nanotubes Synthesized Using Ni Nanowire Templates*, Nano Lett. 2010, 10, 4844-4850, American Chemical Society, Oct. 28, 2010. However, unlike the process disclosed by Wang utilizing a sacrificial Ni nanowire template, the present invention utilizes a silica optic fiber 114 that is retained as an essential component of the optic fiber contained within a cylindrical graphene sheet, i.e. a carbon nanotube, capped at both ends to encapsulate optic fiber 114. Processes for direct chemical vapor deposition of graphene on dielectric surfaces such as silica are described in the following publication, hereby incorporated by reference: Ariel Ismach, Clara Druzgalski, Samuel Penwell, Adam Schwartzberg, Maxwell Zheng, Ali Javey, Jeffrey Bokor, and Yuegang Zhang, *Direct Chemical Vapor Deposition of Graphene on Dielectric Surfaces*, Nano Lett. 2010, 10, 1542-1548, American Chemical Society, Apr. 2, 2010.

In another exemplary process, graphene capsule 120 may be deposited directly on to optic fiber 114 without the use of a metal catalyst, such as sacrificial copper layer 102. The CVD is performed in an atmospheric pressure hot-wall quartz tube furnace. $CH_4$ is used as a carbon precursor gas, mixed with auxiliary reduction ($H_2$) and carrier (Ar) gases. The optic fiber core 100 is heated to 1000° C. (at a rate of 30° C. /min) under $H_2$ (50 sccm) and Ar (1000 sccm) atmosphere and kept at 1000° C. for 3 min. Then, 300 sccm $CH_4$ is introduced to initiate the formation of graphene. The typical growth time is 30-60 min. After the deposition, the $CH_4$ flow is stopped, leaving other gases to flow for further 3 min to remove residual reaction gases before allowing the chamber to naturally cool to room temperature (20° C./min) in the same $H_2$—Ar atmosphere. The graphene layer 104 can also be deposited directly on $SiO_2$ by using other hydrocarbon precursors, such as $C_2H_2$, showing the generality of the process. The growth of graphene directly on a silica substrate is reported in the following publication, hereby incorporated by reference: Jie Sun, Niclas Lindvall, Matthew T. Cole, Teng Wang, Tim J. Booth, Peter Boggild, Kenneth B. K. Teo, Johan Liu, and August Yurgens. *Controllable chemical vapor deposition of large area uniform nanocrystalline graphene directly on silicon dioxide*. Journal of Applied Physics 111, 044103 (2012).

While optic fiber 114 may be formed of silica, other glasses with higher indicies of refraction may be used for optic fiber core 110 and cladding 112. For example, it may be desirable to make optic fiber core 110 and cladding 112 from halide-chalcogenide glasses. The processes discussed above are not compatible with halide-chalcogenide glasses due to the high temperatures of the CVD process. Halide-chalcogenide glasses have a melting temperature of 378° C. and would not survive a CVD process at 900-1100° C. However, a variety of low-temperature graphene synthesis techniques are known with very low thermal budgets. With these techniques, the halide-chalcogenide glasses are heated to temperatures around 300° C. for graphene growth. For example, a halide-chalcogenide optic fiber core 100 may be heated in a CVD chamber to 300° C. and exposed to a benzene precursor as the carbon source to create a monolayer of graphene. This process is reported in the following publication, hereby incorporated by reference: Zhancheng Li, Ping Wu, Chenxi Wang, Xiaodong Fan, Wenhua Zhang, Xiaofang Zhai, Changgan Zeng, Zhenyu Li, Jinlong Yang, and Jianguo Hou. *Low-Temperature Growth of Graphene by Chemical Vapor Deposition Using Solid and Liquid Carbon Sources*. ACSNANO VOL. 5, NO. 4, 3385-3390, 2011. In an alternative low temperature process, graphene film may be synthesized on a halide-chalcogenide optic fiber core 100 at 280° C. utilizing a microwave plasma treatment in combination with PolyMethylMethacrylate (PMMA). With this process, a layer of PMMA is spin-coated onto a halide-chalcogenide optic fiber core 100 at room temperature. The PMMA coated halide-chalcogenide optic fiber core 100 is then inserted into a slot antenna-type microwave plasma CVD system for microwave plasma treatment at 280° C. The plasma treatment time is 30 seconds. This plasma treatment process is disclosed in the following publication, hereby incorporated by reference: Takatoshi Yamada, Masatou Ishihara, and Masataka Hasegawa. *Low Temperature Graphene Synthesis from Poly(methyl methacrylate) Using Microwave Plasma Treatment*. Applied Physics Express 6 (2013) 115102-1.

Figure 5:
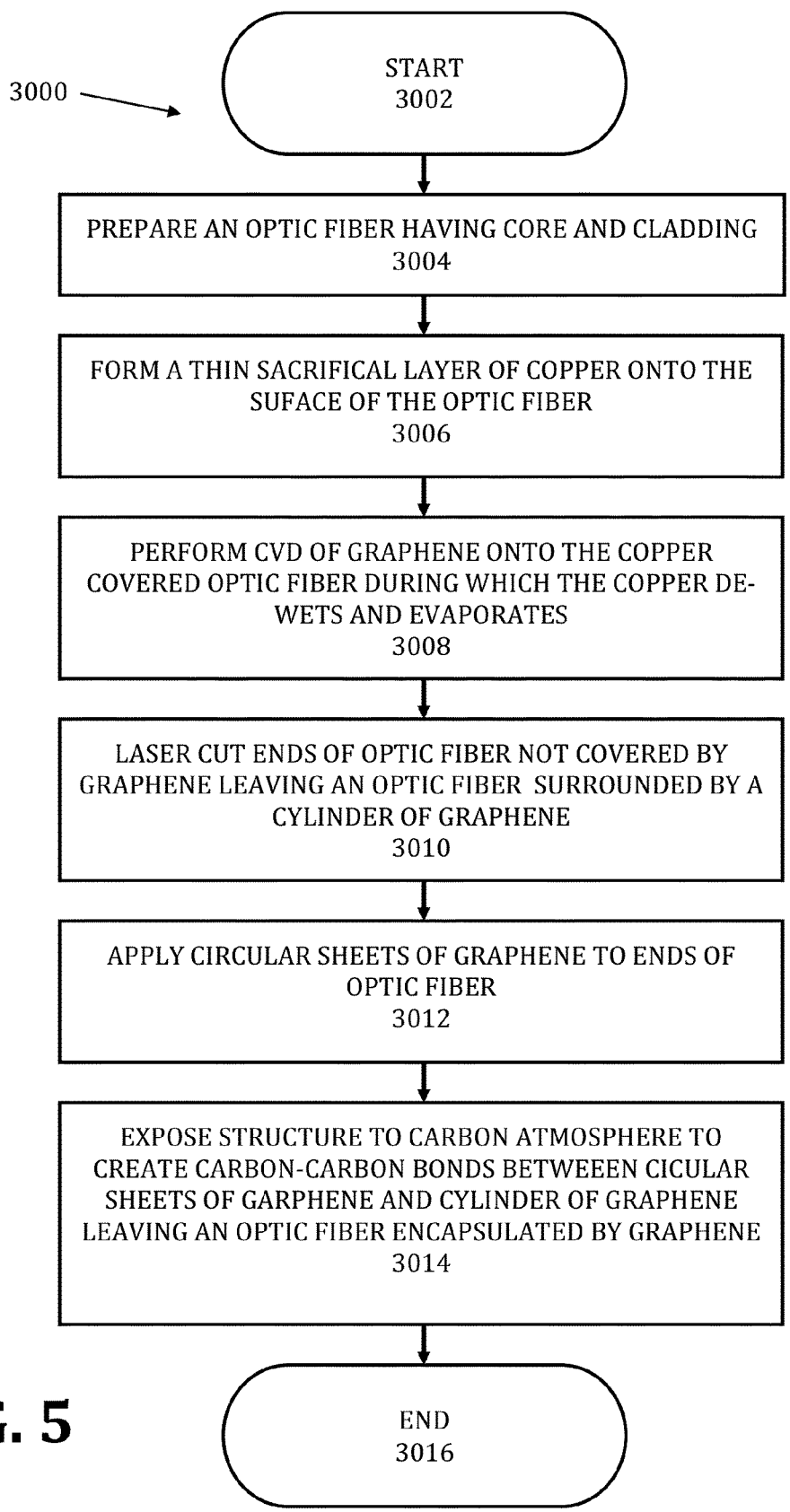
FIG. 5 illustrates a flow chart depicting a process of fabricating an optic fiber having a core and cladding encapsulated by a graphene layer.

FIG. 5 illustrates a flow chart 3000 depicting an exemplary process of fabricating an optic fiber 116 having a core 110 and cladding 112 encapsulated by a graphene layer 120 that forms mechanical support and an optic wave guide around cladding 112. The process begins with START 3002. An optic fiber having a core and cladding made of silica is prepared and cleaned with acetone and alcohol in step 3004. In step 3006, a thin sacrificial layer of copper is formed onto the surface of optic fiber 114. Next in step 3008, a CVD process is performed depositing graphene layer 104 onto optic fiber 114 during which the sacrificial copper layer 102 evaporates. Then in step 3010, the ends of optic fiber core 114 not covered by graphene cylinder 104 are cut for example, by a laser. In this step, optic fiber 114 and graphene cylinder 104 are cleaned. In step 3012, circular sheets of graphene 106 are applied to the ends of optic fiber 114, thereby forming a graphene capsule encapsulating optic fiber 114. In step 3014, exposing graphene sheets 106 and graphene cylinder 104 to a carbon atmosphere creates carbon-carbon bonds between graphene cylinder and graphene sheets 106, thereby further creating a graphene capsule encapsulating optic fiber 116. The process ENDS with step 3016.

Figure 6:
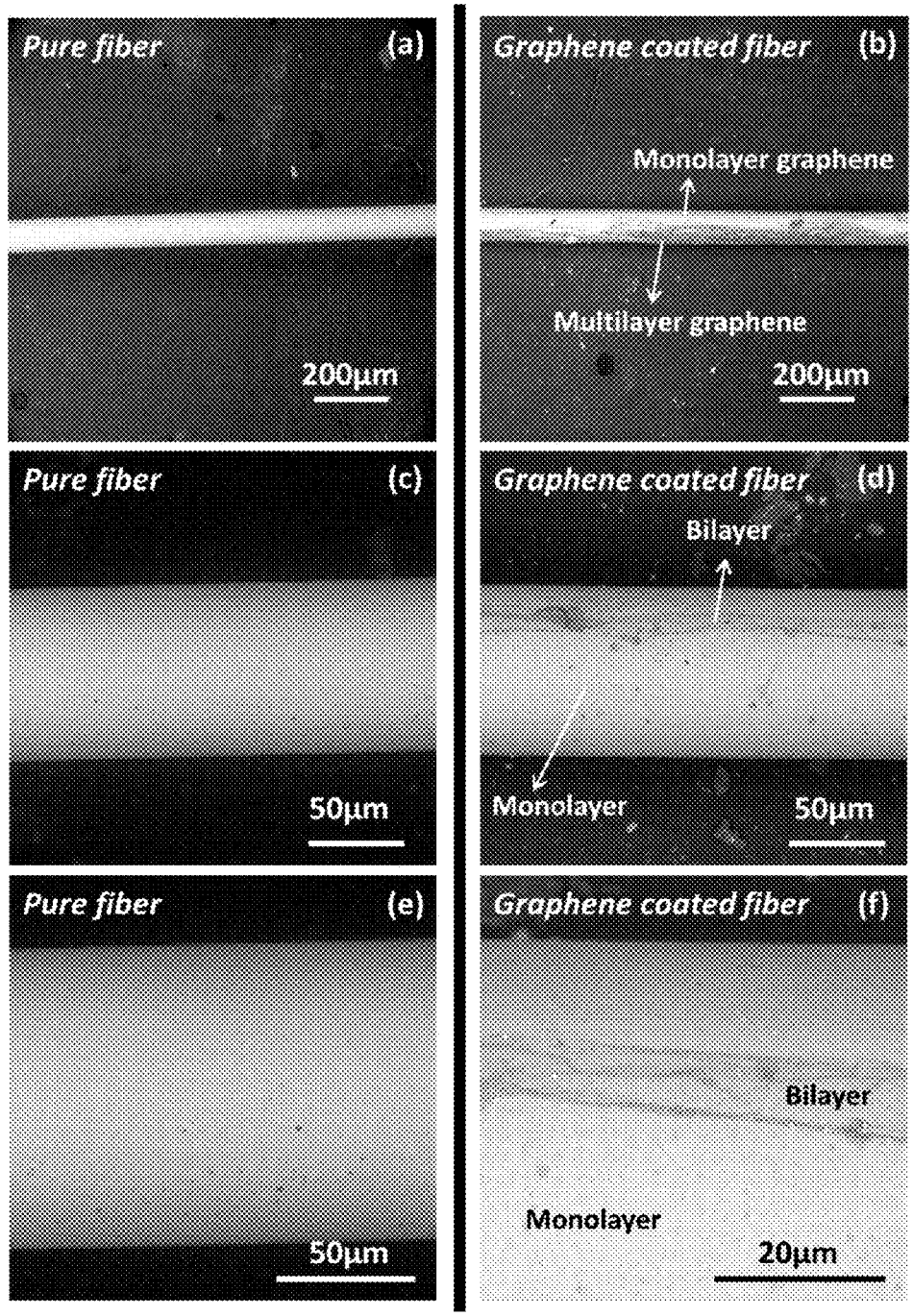
FIG. 6 illustrates Scanning Electron Microscope (SEM) images of a pure optic fiber that is not coated with graphene adjacent to an optic fiber that is coated with graphene at three different resolutions.

FIG. 6 illustrates Scanning Electron Microscope (SEM) images of a pure optic fiber that is not coated with graphene adjacent to an optic fiber that is coated with graphene at three different resolutions. FIG. 6(*a*) illustrates an SEM image of a pure silica optic fiber that is not coated with graphene at a magnification of 150×. FIG. 6(*b*) illustrates an SEM image of a optic fiber coated with a graphene cylinder at a magnification of 150×. The graphene cylinder is a monolayer of graphene in portions and multilayer graphene in other portions. The graphene coated areas are a bit darker than the pure silica fiber, particularly in the areas where the graphene is multilayer. FIG. 6(*c*) illustrates an SEM image of a pure silica optic fiber that is not coated with graphene at a magnification of 800×. FIG. 6(*d*) illustrates an SEM image of a optic fiber coated with a graphene cylinder at a magnification of 800×. In FIG. 6(*d*), it can been seen that the graphene conforms highly to the contours of the optic fiber. The darker areas of graphene indicate that monolayer graphene may be overlapped to form bi-layer or multilayer graphene. FIG. 6(*e*) illustrates an SEM zoomed-in image of a pure silica optic fiber that is not coated with graphene at a magnification of 800×. FIG. 6(*f*) illustrates an SEM image of a optic fiber coated with a graphene cylinder at a magnification of 1200×. At this resolution, it can be seen in FIG. 6(*f*) that the surface of the silica fiber is very clean and smooth and covered with a highly conforming layer of graphene. In FIG. 6(*f*), graphene layer is in portions a monolayer and in portions a bi-layer, as evidenced by the darker wrinkled areas of graphene.

Figure 7:
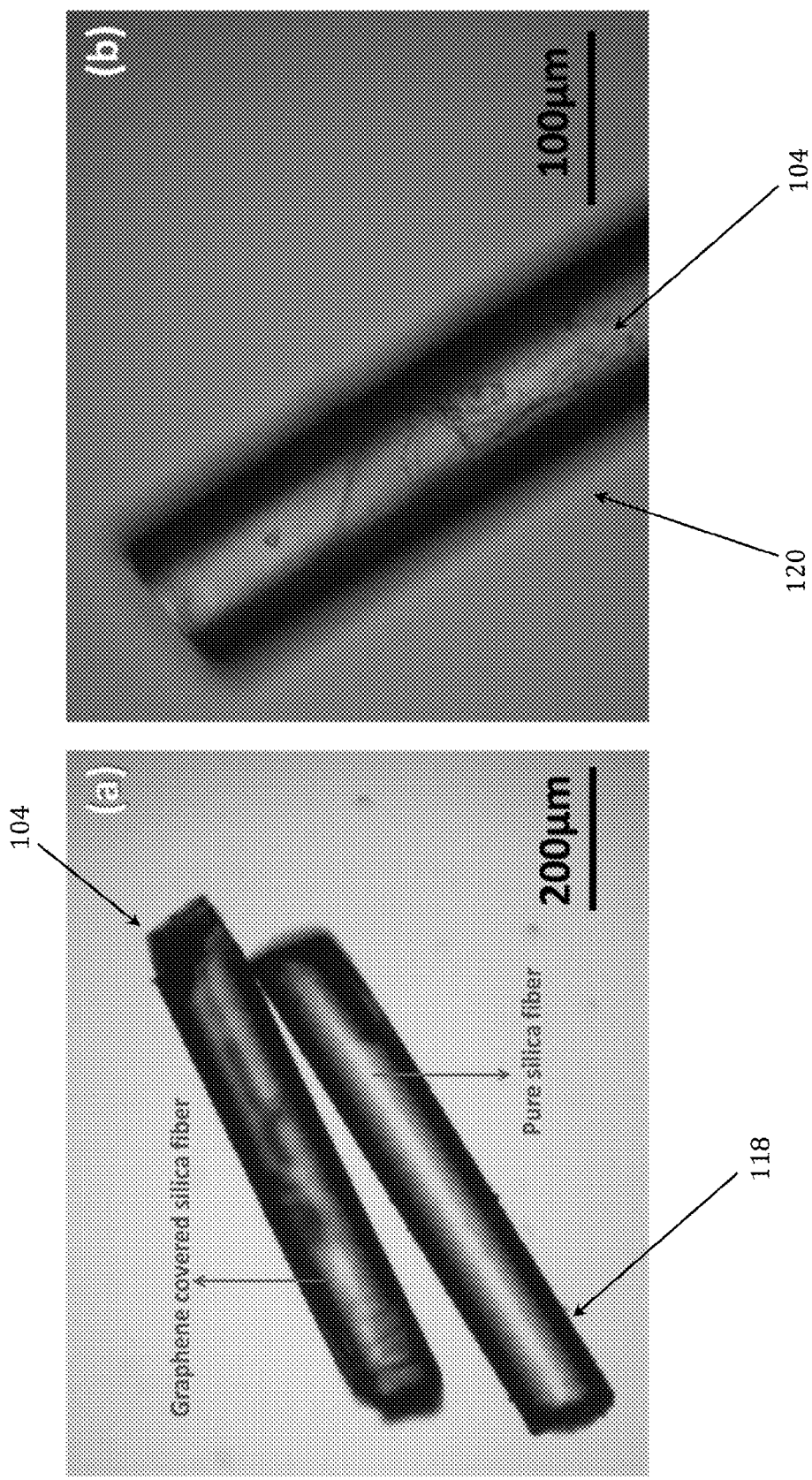
FIG. 7 illustrates an (a) Optical Microscope (OPM) image of a graphene covered silica fiber adjacent to a pure silica fiber not coated with graphene along with a (b) higher resolution OPM image of a graphene coated silica fiber.

FIG. 7 illustrates an (*a*) Optical Microscope (OPM) image of a graphene covered silica fiber 114 adjacent to a pure silica fiber 118 not coated with graphene along with a (*b*) higher resolution OPM image of a graphene coated silica fiber 114. In FIG. 7(*a*), the silica optic fiber 114 is encapsulated by a graphene capsule 120. It is observed the that graphene encapsulated optic fiber is darker in color than the pure silica fiber below it that is not covered with graphene. In addition, the pure silica fiber that is not covered with graphene has a smoother appearing surface than the graphene encapsulated fiber that shows the various layers of the graphene coating. In FIG. 7(b), graphene encapsulated optic fiber 104 is viewed at a higher optical resolution revealing the graphene capsule 120 deposited on the fiber. The various shading or coloring differences on the surface of fiber 104 show the graphene deposition in either a monolayer, bi-layer, or multilayer of graphene. FIG. 7(b) illustrates that the graphene conforms to the contours of optic fiber 104 and uniformly covers it.

Figure 8:
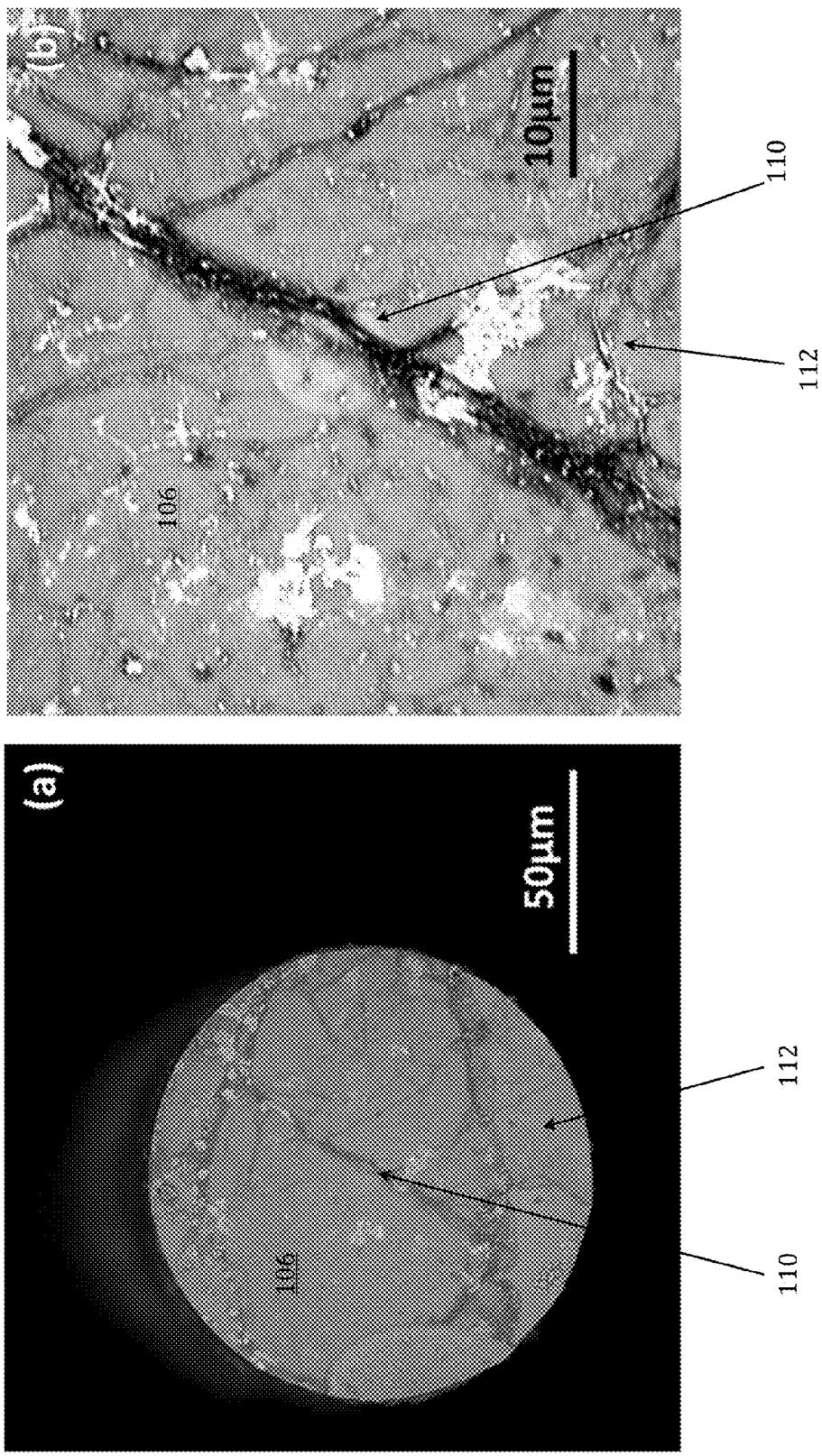
FIG. 8 illustrates SEM images of an end of optic fiber core and cladding completely coated with graphene.

FIG. 8 illustrates SEM images of an end of an optic fiber core 110 and cladding 112 completely coated with graphene 106. Optic fiber core 110 is visible in FIG. 8(a) and FIG. 8 (b) as a white dot at the center of the image. Surrounding optic fiber core 110 is silica cladding 112. The mottled transparent surface covering the end of optic fiber core 110 and silica cladding 112 is graphene coating 106. The various differences of color of graphene coating 106 reveals that portions of graphene coating 106 are formed of a monolayer of graphene, a bi-layer of graphene, or a multilayer of graphene. The darker portions of graphene layer 106, appearing as veins, have the most number of overlapping graphene layers.

Figure 9:
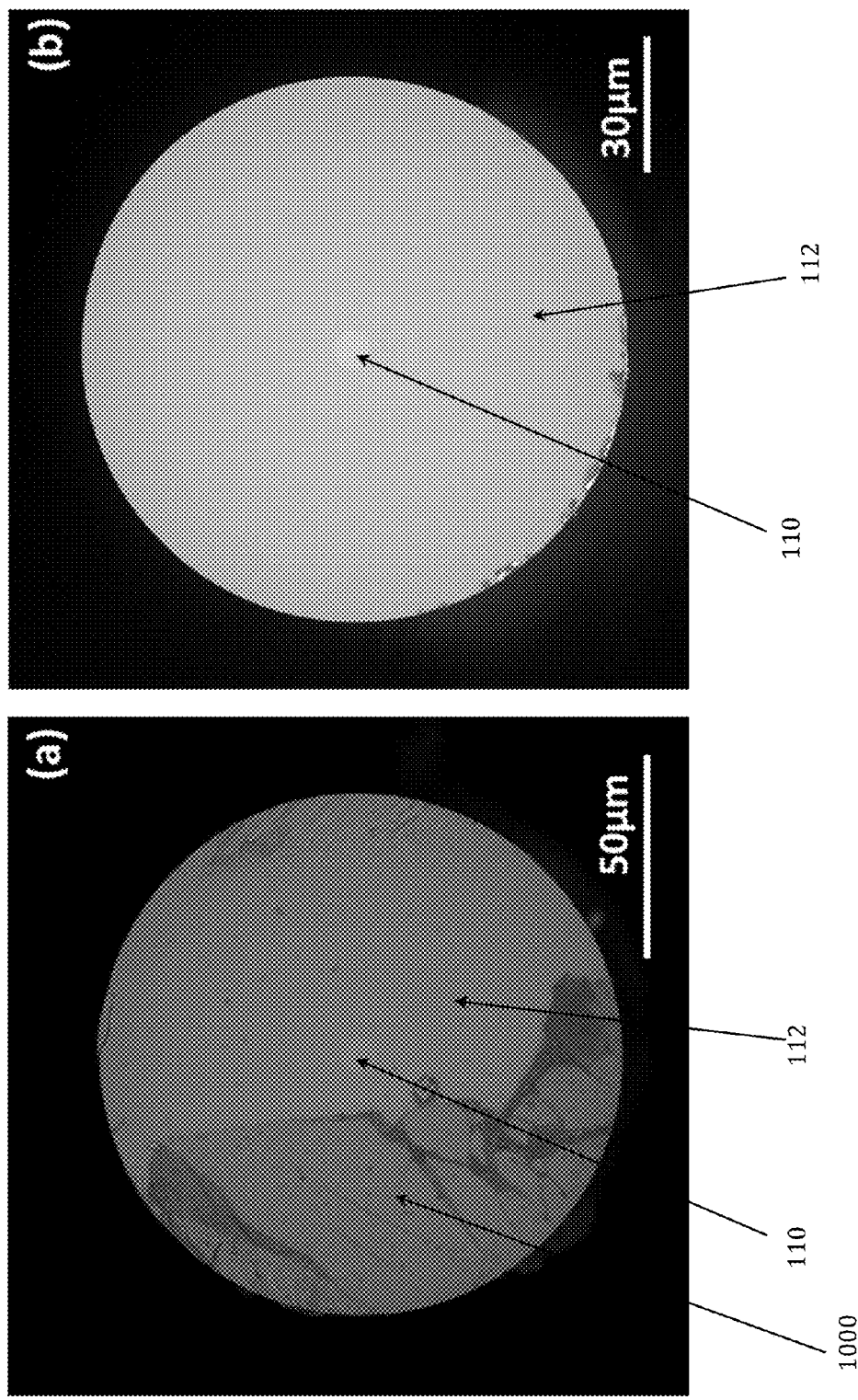
FIG. 9 illustrates SEM images of an end of an optic fiber core and cladding partially coated with graphene adjacent to an end of an optic fiber core and cladding that is not coated with any graphene.

FIG. 9 illustrates SEM images of an end of an optic fiber core 110 and cladding 112 partially coated with graphene 1000 adjacent to an end of an optic fiber core 110 and cladding 112 that is not coated with any graphene. FIG. 9 is provided to compare and contrast the end of an optic fiber core 110 and cladding 112 that is partially covered with graphene 1000 in FIG. 9(a) and not covered at all with graphene in FIG. 9(b) to the optic fiber core 110 and cladding end of FIG. 8(a) and (b) that is completely covered with graphene sheet 106. In FIG. 9(b), the end of optic fiber core 110 and cladding 112 is bright and uniform in color and texture. In FIG. 9(b), a portion of the end of cladding 112 is covered with graphene layer 1000 that shows variances in color/texture due to the fact that some of layer 1000 is a monolayer, a bi-layer, or multilayer of graphene. The darker the color of graphene layer 1000 indicates more layers of graphene compared to lighter areas in color.

Figure 10:
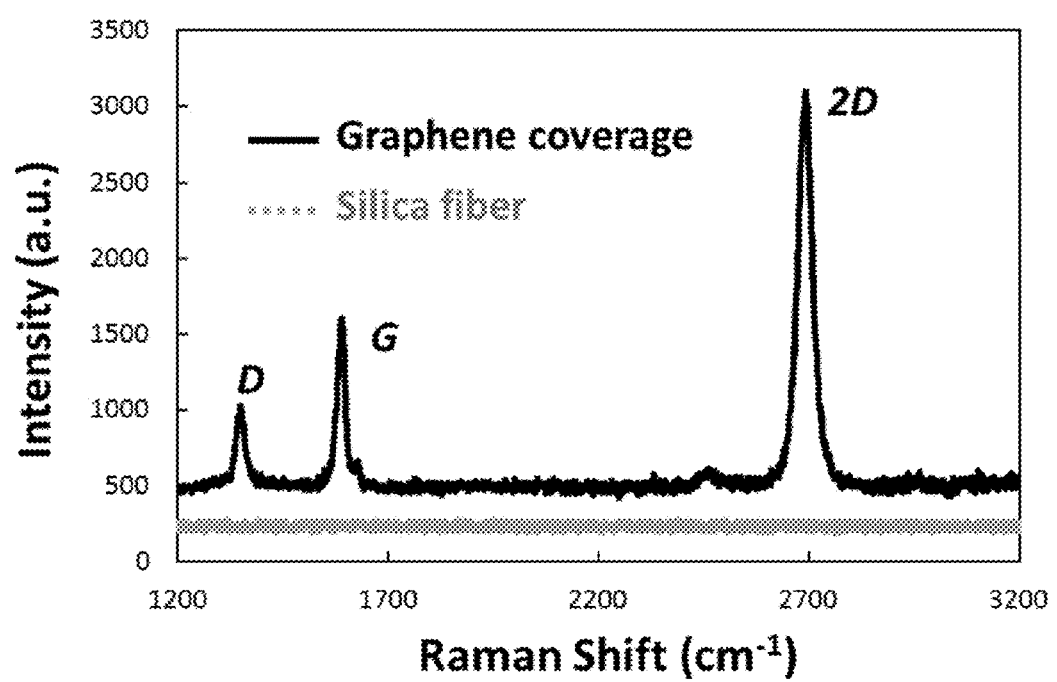
FIG. 10 illustrates a Raman spectra of a graphene coated optic fiber and an optic fiber not coated with graphene for comparison.

FIG. 10 illustrates a Raman spectra of a graphene coated optic fiber 108 or 116 and an optic fiber not coated with graphene for comparison. The black solid curve presents the Raman spectra of graphene coating 120 of fiber 108 or 116. The narrow D, G and 2D peaks at 1350 cm$^{-1}$, 1580 cm$^{-1}$ and 2690 cm$^{-1}$ show the graphene coating 120 on fiber 108 or 116 is of high quality. To compare and contrast, the grey dashed curve presents the Raman spectra of a silica fiber 100 or 114 without a graphene coating 120. Note that there area no peaks in the window of 1200 cm$^{-1}$ to 3200 cm$^{-1}$ for the fiber not coated with graphene.

Figure 11:
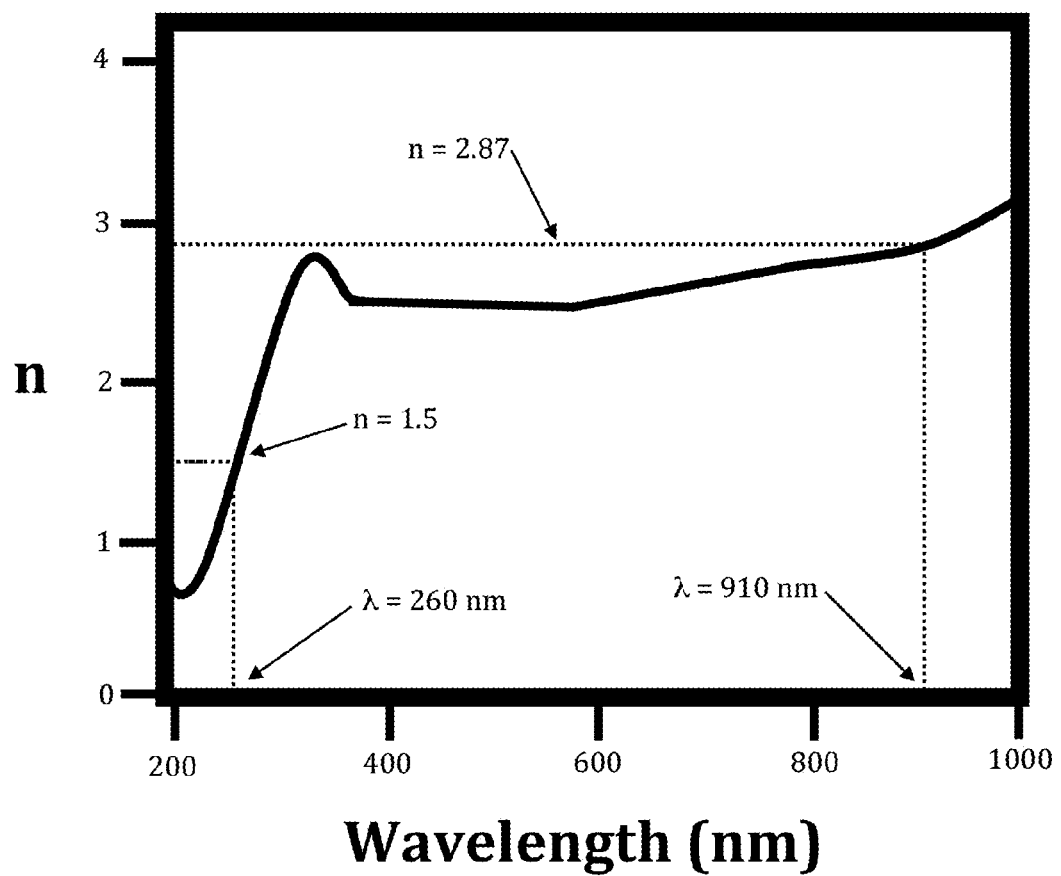
FIG. 11 illustrates the wavelength dependence of the index of refraction n for graphene.
Figure 12:
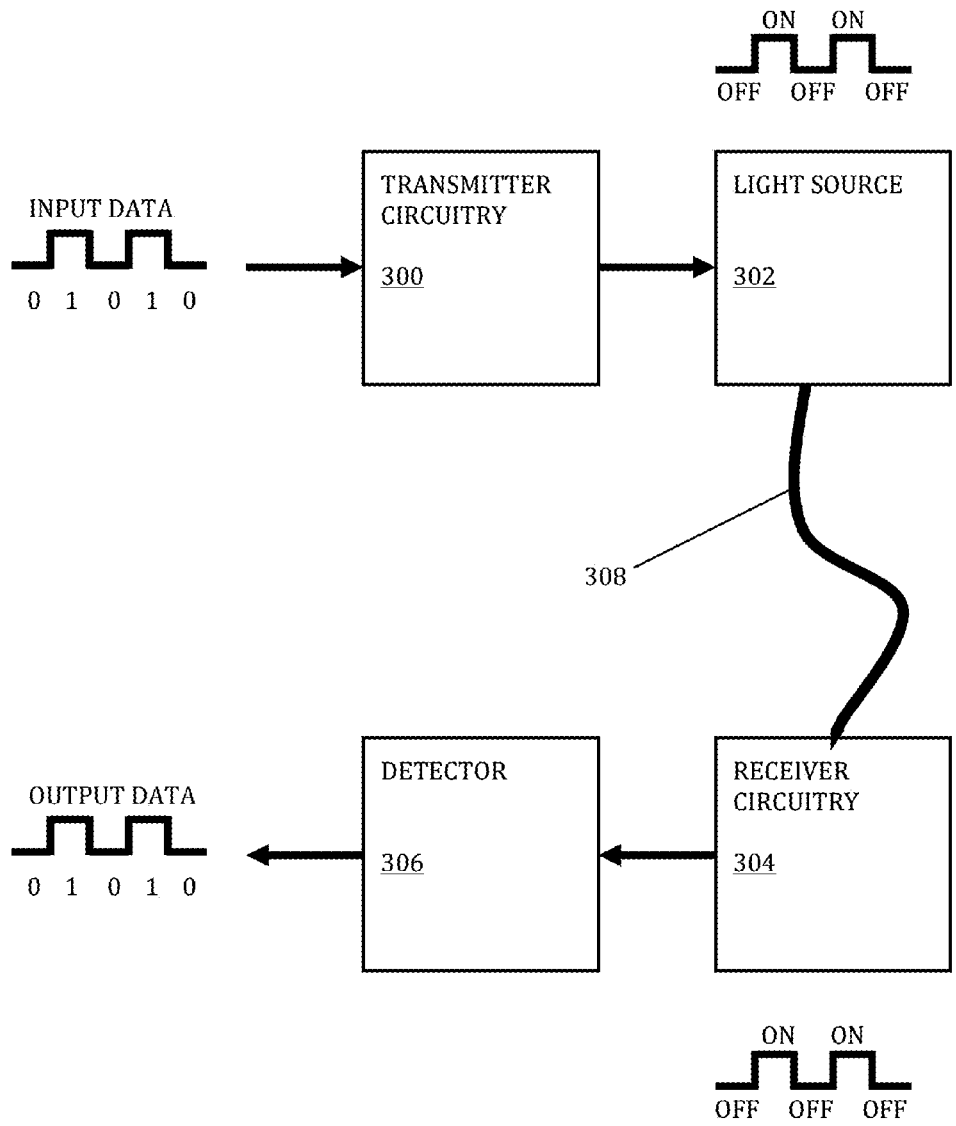
FIG. 12 illustrates an opto-electronic circuit utilizing a graphene coated optic fiber.

FIG. 11 illustrates the wavelength dependence of the index of refraction n for graphene. The index of refraction of graphene n is dependent upon the wavelength of light. Light having a wavelength from 200 nm to 400 nm is in the ultraviolet spectrum. Light having a wavelength in the range of 400 nm to 600 nm is in the violet-yellow spectrum. Light having a wavelength in the range of 600 nm to 800 nm is in the orange to red spectrum. Light having a wavelength in the range of 800 nm to 1000 nm is in the infrared spectrum. The wavelength dependence of the index of refraction n for graphene is reported in the following reference hereby incorporated by reference: Alex Gray, Mehdi Balooch, Stephane Allegret, Stefan De Gendt, and Wei-E Wang. *Optical detection and characterization of graphene by broadband spectrophotometry*. Journal of Applied Physics 104, 053109 (2008). As shown in FIG. 11, graphene has an index of refraction n<1 at 200 nm. Graphene exhibits an index of refraction n<1.5 below a wavelength of 260 nm. Silica is a common material for optic fiber cores 100 and 110. Silica has an index of refraction of n=1.5. Thus, when optic fiber core 100 is made of silica and propagates light having a wavelength of less than 260 nm, graphene layer 120 can function as cladding because graphene layer 120 has a lower index of refraction than that of silica. An exemplary UV optic circuit utilizing a deep UV LED to emit deep UV light having a wavelength of 245 nm through an optic fiber core 100 encapsulated in a graphene cladding layer 120 is shown in FIG. 12. At 245 nm, optic fiber core 100 or 110 may be made of silica and encapsulated by a graphene layer 120 for cladding. Deep UV LEDs having a wavelength of 210 nm are also known and may be used in combination with optic fiber core 100 or 110, allowing for smaller diameter sizes for optic fiber core 100 or 110 with a silica core and graphene cladding 120.

Referring again to FIG. 11, graphene generally exhibits an index of refraction below 3 up to 900 nm. While optic fiber core 100/110 is generally made of silica (SiO$_2$), other types of glasses may be used for optic fiber core 100/110. In particular, a variety of high index of refraction glasses may be used for optic fiber core 100/110. Through utilizing a glass with a higher index of refraction, it is possible to utilize a graphene layer 120 as a cladding layer at higher wavelengths of light. For example, halide-chalcogenide glasses have properties that make them suitable for optical fibers and they are reported to have indices of refraction n ranging from 2.54 to 2.87 as reported in the following reference hereby incorporated by reference: Jan Wasylak, Maria Lacka, Jan Kucharski. *Glass of high refractive index for optics and optical fiber*. Opt. Eng. 36(6) 1648-1651 (June 1997) Society of Photo-Optical Instrumentation Engineers. As illustrated in FIG. 11, when optic fiber core 100/110 is made of a Halide-chalcogenide glass with an index of refraction of 2.87, graphene can be used as a cladding layer 120 for light of wavelengths of less than 910 nm, which is in the infrared portion of the spectrum. Thus, for the deep UV, visible, and a portion of the infrared spectrum Halide-chalcogenide glass may be used for optic fiber core 100/110 and propagate light from 200 nm to 900 nm with a graphene cladding layer 120. The use of silica and halide-chalcogenide glasses are merely exemplary. It is contemplated that any glass may be utilized for optical fiber core 100/110 in connection with a graphene cladding capsule 120 with the limitation that the propagation of light wavelengths is limited to the range such that the index of refraction of the graphene is less than the index of refraction of the particular glass used for optic fiber core 100/110. Examples of other high index refraction glasses include PbO glass that has an index of refraction of n=2. Lanthanum dense flint glass has a refractive index of n=1.8. Flint glass has a refractive index of 1.62. To utilize graphene as a cladding layer, it may be desirable to utilize a monolayer of graphene. Alternatively, it may be desirable to grow multilayer graphene to form a cladding layer.

FIG. 12 illustrates an opto-electronic circuit utilizing a graphene coated optic fiber 308. Input data is received by transmitter circuitry 300. Transmitter circuitry 300 controls a light source 302, such as a laser, to transmit light signals across optic fiber 308. In a preferred embodiment, light source 302 is a deep ultraviolet laser or LED having a wavelength of 245 nm and power of 30-70 µW having an AlGaN structure. An exemplary optic cable 308 is of the form shown in FIG. 2 or 5 that includes a silica optic fiber core 100/110 encapsulated by a graphene capsule 120. The core 100 may additionally be surrounding by a cladding 112, which is also encapsulated by graphene capsule 120. The silica optic fiber core 100 in this example has a diameter of 250 nm to 405 nm. As the wavelength of the UV light is 245 nm, graphene capsule 120 functions as a cladding layer due to the fact that at a wavelength of 245 nm, graphene has an index of refraction that is less than silica as shown by FIG. 11. Light source 302 is turned ON and OFF corresponding to the input data to transmit a signal across optic cable 308. A receiver circuit 304 receives the deep UV signals emitted by deep UV LED 302. Receiver circuit 304 receives the light impulses signifying the input data signal. Detector circuit 306 converts the received optical signal into output data. Developing circuitry that operates based on light transmitted at higher optical frequencies will allow for faster data transmission and hence, increased bandwidth. The use of UV light will greatly enhance data transmission rates over existing optical wavelengths. FIG. 12 shows a unidirectional optical transmission circuit that in that data is transmitted from light source 302 across fiber 308 to receiver circuitry 304.

Figure 13:
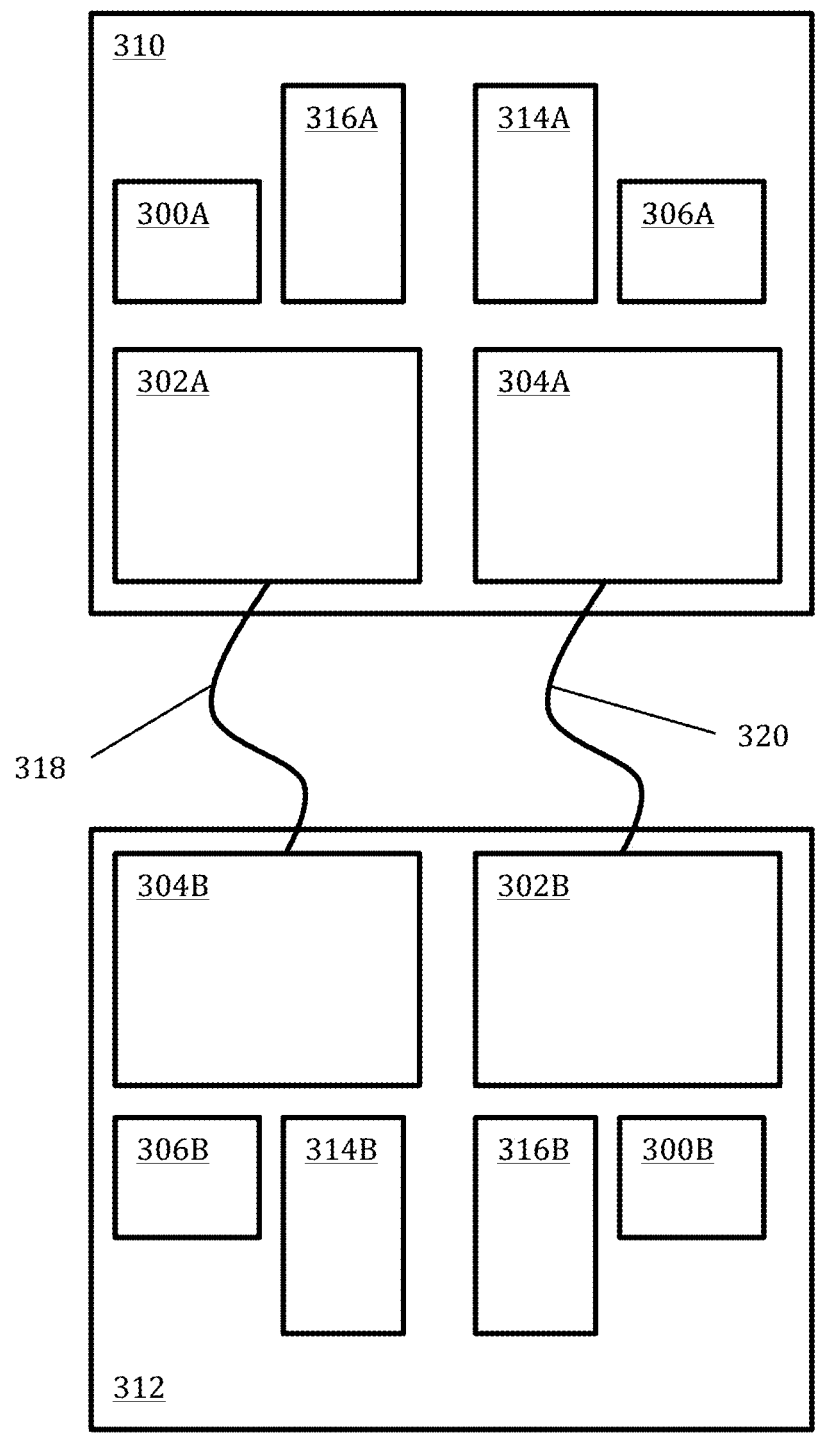
FIG. 13 illustrates a pair of microchips configured to communicate with each other across optic fibers.

FIG. 13 illustrates a pair of microchips 310 and 312 configured to communicate with each other across a optic fibers 318 and 320. Microchip 310 includes transmitter circuitry 300A and a light source 302A, which is typically a laser. Microchip 310 also includes a controller 314A and memory 316A. Controller 314A controls the operation of chip 310A. Memory 316A stores data that is to be sent to chip 312, or is received from chip 312. Microchip 312 includes transmitter circuitry 300B and a light source 302B, which is typically a laser. Microchip 310 also includes a controller 314B and memory 316B. Controller 314B controls the operation of chip 310. Memory 316B stores data that is to be sent to chip 310, or is received from chip 310. Transmitter circuitry 300A prepares data from memory 316A to be sent across dedicated optic fiber transmission line 318 to receiver circuitry 304B, which is an optic detector. Detector circuit 306B converts the optic signals received by receiver circuitry 304B into data that is stored in memory 316B. Transmitter circuitry 300B prepares data from memory 316B to be sent across dedicated optic fiber transmission line 320 to receiver circuitry 304A, which is an optic detector. Detector circuit 306A converts the optic signals received by receiver circuitry 304A into data that is stored in memory 316A. Typically, optic fibers transmit signals in a single direction. Thus, two optic fiber transmission lines 318 and 320 are required for bi-directional communication as shown in FIG. 13. It is contemplated that lasers 302A and 302B are ultraviolet lasers and optic fibers 318 and 320 are formed of optic fiber cores 100/110 that are encapsulated by graphene capsules 120. However, any wavelength of light might be used. The use of ultraviolet light is merely exemplary. The optic circuitry of FIG. 13 can be used in combination with Small Form-factor Pluggable (SFP) transceivers, which are available in a variety of transmitter and receiver types that can function as transmitters 300/302 and receivers 304/306. As each fiber 318 and 320 is unidirectional for communication, the combined pair of them is required to form an optical fiber cable.

While the invention has been shown and described with reference to a particular embodiment thereof, it will be understood to those skilled in the art, that various changes in form and details may be made therein without departing from the spirit and scope of the invention.

I claim:

1. A graphene coated optic-fiber, comprising:
   an optic fiber core, and
   a graphene capsule fully encapsulating said optic fiber core on all sides, thereby forming a cladding layer.

2. The graphene coated optic-fiber of claim 1, wherein said graphene capsule consists of a contiguous lattice of covalently bonded carbon atoms that form a monolayer of graphene directly on said optic fiber core.

3. The graphene coated optic-fiber of claim 1, wherein said graphene capsule consists of a contiguous lattice of covalently bonded carbon atoms that form multilayer graphene directly on said optic fiber core.

4. The graphene coated optic-fiber of claim 1, wherein said graphene capsule comprises a unitary contiguous layer of graphene all of which is in direct contact with said optic fiber core.

5. The graphene coated optic-fiber of claim 4, wherein said graphene capsule is deposited onto said optic fiber core through a Chemical Vapor Deposition (CVD) process utilizing a sacrificial copper layer formed on said optic fiber core.

6. The graphene coated optic-fiber of claim 1, wherein said graphene capsule is formed of a graphene cylinder with two circular graphene end surfaces.

7. The graphene coated optic-fiber of claim 6, wherein said graphene cylinder is formed through a CVD process utilizing a sacrificial copper layer formed on said optic fiber core.

8. The graphene coated optic-fiber of claim 7, wherein the two circular graphene end surfaces are adhered to end surfaces of said optic fiber core.

9. The graphene coated optic-fiber of claim 8, wherein carbon-carbon bonds are formed between the two circular graphene end surfaces and the graphene cylinder via exposure to a carbon atmosphere.

10. The graphene coated optic-fiber of claim 1, wherein said optic fiber core is made of a material selected from a group consisting of silica, a halide-chalcogenide glass, PbO glass, flint glass, and Lanthanum dense flint glass.

11. A graphene coated optic-fiber, comprising:
   an optic fiber core;
   a cladding layer surrounding said optic fiber core; and
   a graphene capsule fully encapsulating said cladding layer on all sides.

12. The graphene coated optic-fiber of claim 11, wherein said graphene capsule consists of a contiguous lattice of covalently bonded carbon atoms directly on said cladding layer.

13. The graphene coated optic-fiber of claim 12, wherein said contiguous lattice of covalently bonded carbon atoms form a monolayer of graphene.

14. The graphene coated optic-fiber of claim 12, wherein said contiguous lattice of covalently bonded carbon atoms form multilayer graphene.

15. The graphene coated optic-fiber of claim 11, wherein said graphene capsule comprises a monolayer of graphene in direct contact with said cladding layer.

16. The graphene coated optic-fiber of claim 11, wherein said optic fiber core and cladding layer are formed of silica, wherein said graphene capsule is deposited as a unitary contiguous layer on said cladding layer through a CVD process, wherein said optic fiber core is made of a material selected from a group consisting of silica, a halide-chalcogenide glass, PbO glass, flint glass, and Lanthanum dense flint glass.

17. An optical circuit, comprising:
   an ultraviolet light source;
   an ultraviolet receiver circuit; and
   an optic fiber optically connecting said ultraviolet light source to said ultraviolet receiver circuit, said optic fiber comprising an optic fiber core fully encapsulated on all sides with graphene.

18. The optical circuit of claim 17, wherein said optic fiber further comprising a cladding layer between said optic fiber core and said graphene.

19. The optical circuit of claim 17, wherein said ultraviolet light source transmits data to said ultraviolet receiver circuit through said optic fiber.

\* \* \* \* \*